(12) United States Patent
Zohni

(10) Patent No.: US 9,117,811 B2
(45) Date of Patent: Aug. 25, 2015

(54) FLIP CHIP ASSEMBLY AND PROCESS WITH SINTERING MATERIAL ON METAL BUMPS

(75) Inventor: Wael Zohni, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 922 days.

(21) Appl. No.: 13/158,797

(22) Filed: Jun. 13, 2011

(65) Prior Publication Data

US 2012/0313239 A1    Dec. 13, 2012

(51) Int. Cl.
| | |
|---|---|
| *H01L 23/48* | (2006.01) |
| *H01L 23/52* | (2006.01) |
| *H01L 29/40* | (2006.01) |
| *H01L 23/498* | (2006.01) |
| *H01L 23/00* | (2006.01) |

(52) U.S. Cl.
CPC .... *H01L 23/49811* (2013.01); *H01L 23/49827* (2013.01); *H01L 24/16* (2013.01); *H01L 24/40* (2013.01); *H01L 24/73* (2013.01); *H01L 24/81* (2013.01); *H01L 24/84* (2013.01); *H01L 24/13* (2013.01); *H01L 2224/0401* (2013.01); *H01L 2224/05573* (2013.01); *H01L 2224/05624* (2013.01); *H01L 2224/05644* (2013.01); *H01L 2224/05647* (2013.01); *H01L 2224/05655* (2013.01); *H01L 2224/11003* (2013.01); *H01L 2224/1134* (2013.01); *H01L 2224/11332* (2013.01); *H01L 2224/13011* (2013.01); *H01L 2224/1357* (2013.01); *H01L 2224/13076* (2013.01); *H01L 2224/13111* (2013.01); *H01L 2224/13113* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13562* (2013.01); *H01L 2224/13564* (2013.01); *H01L 2224/13566* (2013.01); *H01L 2224/13611* (2013.01); *H01L 2224/13613* (2013.01); *H01L 2224/13639* (2013.01); *H01L 2224/13647* (2013.01); *H01L 2224/1624* (2013.01); *H01L 2224/16111* (2013.01); *H01L 2224/16225* (2013.01); *H01L 2224/16227* (2013.01); *H01L 2224/16237* (2013.01); *H01L 2224/32225* (2013.01);

(Continued)

(58) Field of Classification Search
CPC ......... H01L 24/81; H01L 24/16; H01L 24/40; H01L 24/73; H01L 24/84; H01L 23/49827; H01L 23/49811
USPC .......... 257/737, 782, E23.068, E23.021, 741, 257/E23.024, E23.028, 746, 772, 779; 438/121, 612, 613, 614, 617, 660, 665, 438/666, 598; 428/613, 304.4, 158, 71, 428/312.8, 209, 312.2, 545, 457, 929; 419/2, 45, 53; 75/415; 174/367, 73.1
See application file for complete search history.

(56) References Cited

U.S. PATENT DOCUMENTS

| | | |
|---|---|---|
| 4,067,104 A | 1/1978 | Tracy |
| 4,642,889 A | 2/1987 | Grabbe |

(Continued)

*Primary Examiner* — Chuong A Luu
*Assistant Examiner* — Cory Eskridge
(74) *Attorney, Agent, or Firm* — Lerner, David, Littenberg, Krumholz & Mentlik, LLP

(57) ABSTRACT

A microelectronic package includes a substrate overlying the front face of a microelectronic element. A plurality of metal bumps can project from conductive elements of the substrate towards the microelectronic element, the metal bumps having first ends extending from the conductive elements, second ends remote from the conductive elements, and lateral surfaces extending between the first and second ends. A conductive matrix material can contact the second ends and at least portions of the lateral surfaces of respective ones of the metal bumps and join the metal bumps with contacts of the microelectronic element.

20 Claims, 20 Drawing Sheets

(52) U.S. Cl.
CPC ............... *H01L 2224/4024* (2013.01); *H01L 2224/40106* (2013.01); *H01L 2224/40475* (2013.01); *H01L 2224/41176* (2013.01); *H01L 2224/45144* (2013.01); *H01L 2224/45147* (2013.01); *H01L 2224/4813* (2013.01); *H01L 2224/48624* (2013.01); *H01L 2224/48644* (2013.01); *H01L 2224/48647* (2013.01); *H01L 2224/73204* (2013.01); *H01L 2224/73213* (2013.01); *H01L 2224/8184* (2013.01); *H01L 2224/81192* (2013.01); *H01L 2224/84* (2013.01); *H01L 2924/01047* (2013.01); *H01L 2924/01327* (2013.01); *H01L 2924/19107* (2013.01); *H01L 2924/3011* (2013.01)

(56) References Cited

U.S. PATENT DOCUMENTS

| Patent | Type | Date | Inventor | Page |
|---|---|---|---|---|
| 4,955,523 | A | 9/1990 | Carlommagno et al. | |
| 5,067,007 | A | 11/1991 | Kanji et al. | |
| 5,133,495 | A | 7/1992 | Angulas et al. | |
| 5,203,075 | A | 4/1993 | Angulas et al. | |
| 5,316,788 | A | 5/1994 | Dibble et al. | |
| 5,455,390 | A | 10/1995 | DiStefano et al. | |
| 5,518,964 | A * | 5/1996 | DiStefano et al. | 438/113 |
| 5,830,389 | A * | 11/1998 | Capote et al. | 252/512 |
| 5,948,533 | A | 9/1999 | Gallagher et al. | |
| 6,399,426 | B1 * | 6/2002 | Capote et al. | 438/127 |
| 2003/0094685 | A1 * | 5/2003 | Shiraishi et al. | 257/686 |
| 2003/0234277 | A1 * | 12/2003 | Dias et al. | 228/180.22 |
| 2004/0164426 | A1 * | 8/2004 | Pai et al. | 257/778 |
| 2007/0013067 | A1 * | 1/2007 | Nishida et al. | 257/737 |
| 2009/0079094 | A1 * | 3/2009 | Lin | 257/778 |
| 2009/0121351 | A1 * | 5/2009 | Endo | 257/737 |
| 2010/0148374 | A1 * | 6/2010 | Castro | 257/778 |
| 2010/0200981 | A1 * | 8/2010 | Huang et al. | 257/692 |

* cited by examiner

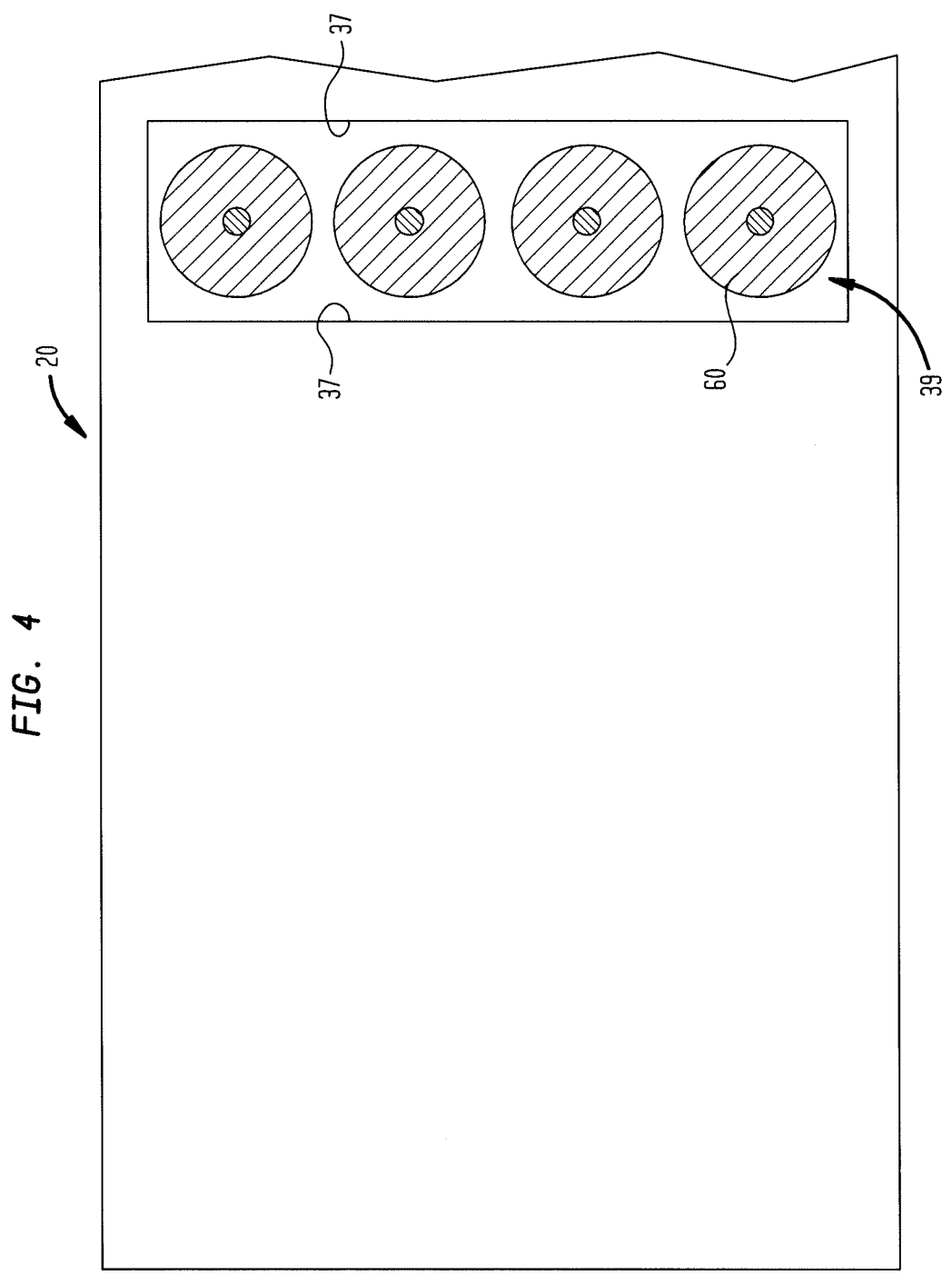

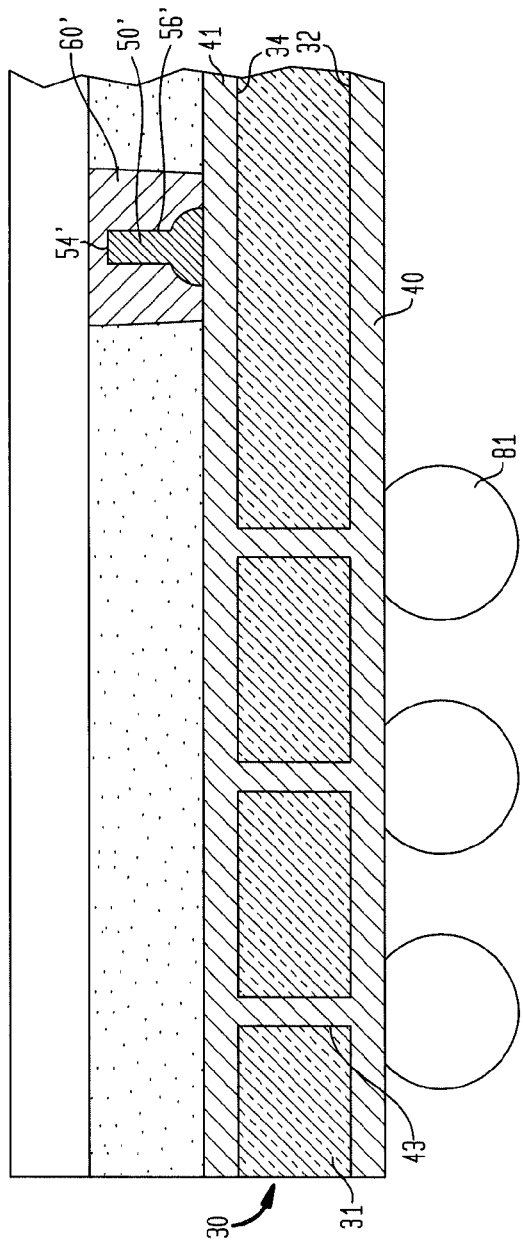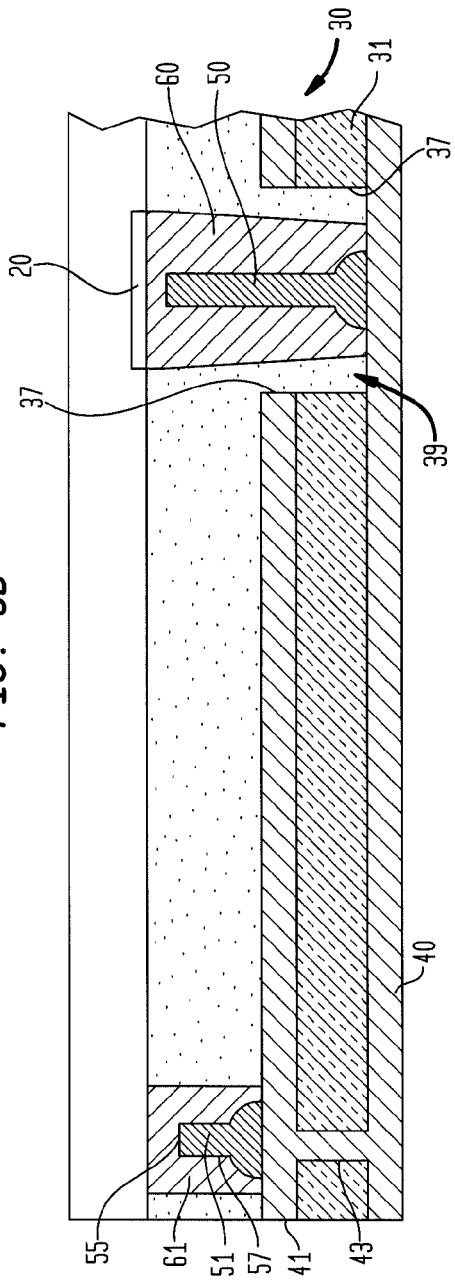

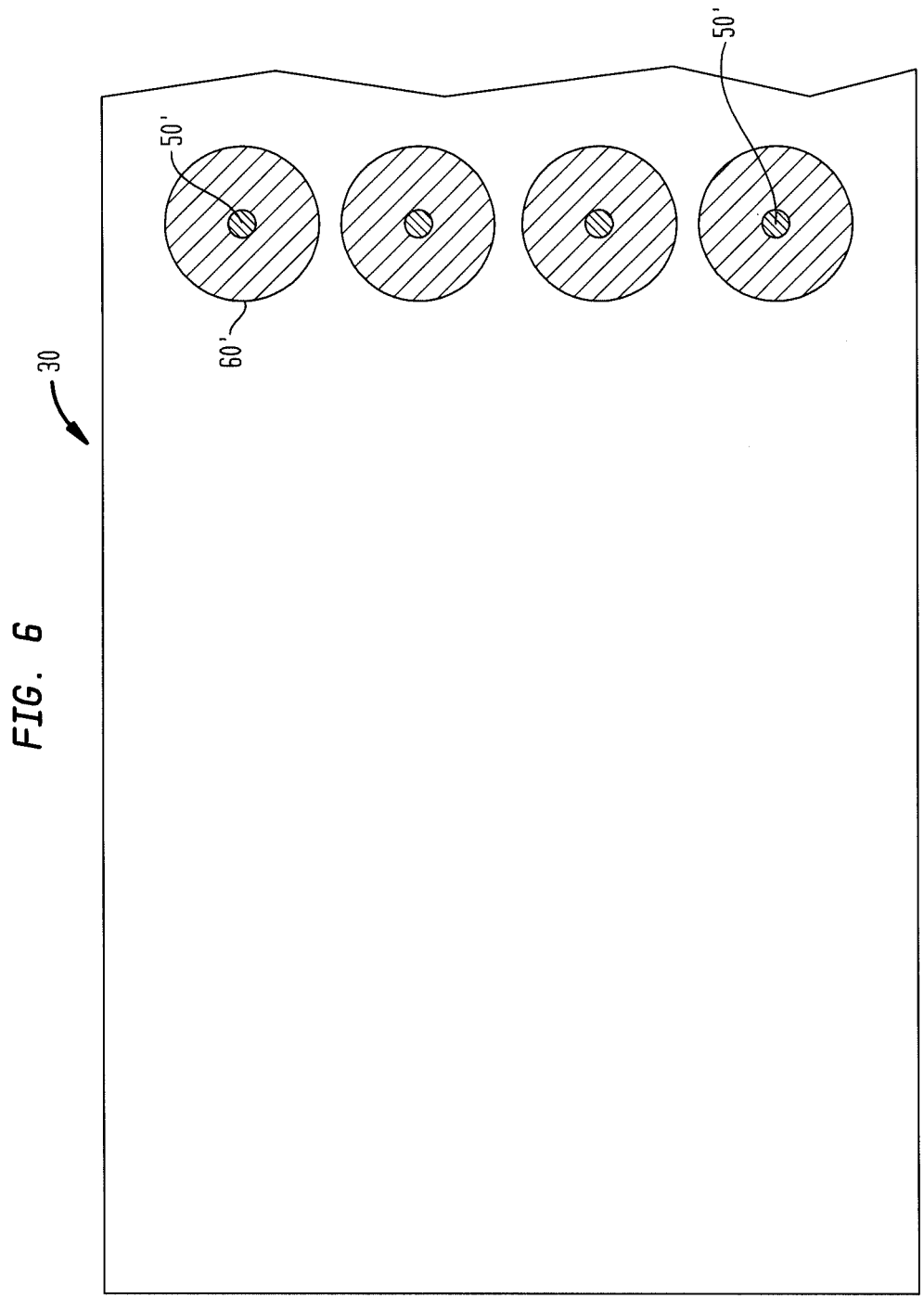

FLIP CHIP ASSEMBLY AND PROCESS WITH SINTERING MATERIAL ON METAL BUMPS

BACKGROUND OF THE INVENTION

Complex microelectronic devices such as modern semiconductor chips require many hundreds of input and output connections to other electronic components. These device connections are generally either disposed in regular grid-like patterns, substantially covering the bottom surface of the device (commonly referred to as an "area array") or in elongated rows extending parallel to and adjacent each edge of the device's front surface. The various prior art processes for making the interconnections between the microelectronic device and the supporting substrate use prefabricated arrays or rows of leads or discrete wires, solder bumps or combinations of both, such as with wire bonding, tape automated bonding ("TAB") and flip-chip bonding.

In a wirebonding process, the microelectronic device may be physically mounted on a supporting substrate. A fine wire is fed through a bonding tool and the tool is brought into engagement with a contact pad on the device so as to bond the wire to the contact pad. The tool is then moved to a connection point of the circuit on the substrate, so that a small piece of wire is dispensed and formed into a lead, and connected to the substrate. This process is repeated for every contact on the chip. The wire bonding process is also commonly used to connect the die bond pads to lead frame fingers which are then connected to the supporting substrate.

In a tape automated bonding ("TAB") process, a dielectric supporting tape, such as a thin foil of polyimide is provided with a hole slightly larger than the microelectronic device. An array of metallic leads is provided on one surface of the dielectric film. These leads extend inwardly from around the hole towards the edges of the hole. Each lead has an innermost end projecting inwardly, beyond the edge of the hole. The innermost ends of the leads are arranged side by side at a spacing corresponding to the spacing of the contacts on the device. The dielectric film is juxtaposed with the device so that the hole is aligned with the device and so that the innermost ends of the leads will extend over the front or contact bearing surface on the device. The innermost ends of the leads are then bonded to the contacts of the device, typically using ultrasonic or thermocompression bonding, and the outer ends of the leads are connected to external circuitry.

In both wire bonding and conventional tape automated bonding, the pads on the substrate are arranged outside of the area covered by the chip, so that the wires or leads fan out from the chip to the surrounding pads. The area covered by the entire assembly is considerably larger than the area covered by the chip. This makes the entire assembly substantially larger than it otherwise would be. Because the speed with which a microelectronic assembly can operate is inversely related to its size, this presents a serious drawback. Moreover, the wire bonding and tape automated bonding approaches are generally most workable with chips having contacts disposed in rows extending along the edges of the chip. They generally do not allow use with chips having contacts disposed in an area array.

In the flip-chip mounting technique, the front or contact bearing surface of the microelectronic device faces towards the substrate. Each contact on the device is joined by a solder bond to the corresponding contact pad on the supporting substrate, as by positioning solder balls on the substrate or device, juxtaposing the device with the substrate in the front-face-down orientation and momentarily reflowing the solder. The flip-chip technique may yield a compact assembly, which occupies an area of the substrate no larger than the area of the chip itself. However, flip-chip assemblies suffer from significant problems when encountering thermal stress. The solder bonds between the device contacts and the supporting substrate are substantially rigid. Changes in the relative sizes of the device and the supporting substrate due to thermal expansion and contraction in service create substantial stresses in these rigid bonds, which in turn can lead to fatigue failure of the bonds. Moreover, it is difficult to test the chip before attaching it to the substrate, and hence difficult to maintain the required outgoing quality level in the finished assembly, particularly where the assembly includes numerous chips.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite these and other efforts in the art, still further improvements in microelectronic interconnection technology would be desirable.

SUMMARY OF THE INVENTION

A microelectronic package is provided according to an aspect of the invention. The microelectronic package includes a microelectronic element having a front face having contacts thereon. A substrate overlies the front face of the microelectronic element and includes a plurality of terminals and conductive elements electrically connected with the terminals. A plurality of metal bumps may project from the conductive elements towards the microelectronic element, the metal bumps having first ends extending from the conductive elements, second ends remote from the conductive elements, and lateral surfaces extending between the first and second ends. A conductive matrix material can contact the second ends and portions of the lateral surfaces of respective ones of the metal bumps and join the metal bumps with the contacts of the microelectronic element.

An interconnection element is provided according to an aspect of the invention. The interconnection element includes a substrate including a plurality of terminals and conductive elements electrically connected with the terminals. A plurality of metal bumps project from the substrate, the metal bumps having first ends adjacent the substrate, second ends remote from the substrate and lateral surfaces extending between the first and second ends. A conductive matrix material can contact the second ends and at least some portion of the lateral surfaces of respective ones of the metal bumps.

In accordance with one or more of the aspects of the invention noted above, in one example, at least some of the conductive elements may be displaced from the terminals in at least one horizontal direction in which the front face of the microelectronic element extends.

In one example, the conductive matrix material may extend along the lateral surfaces of the metal bumps within at least one opening of the substrate. The conductive matrix material may even contact entire lateral surfaces of the metal bumps.

In one example, the substrate may include a dielectric element having an aperture, and the conductive matrix material may or may not contact an edge of the aperture.

In one embodiment, the substrate has a surface confronting the front face of the microelectronic element, and second metal bumps can extend in a direction between the surface of the substrate to remote ends thereof adjacent the microelectronic element. A second conductive matrix material can contact respective ones of the second metal bumps and overlying the remote ends of the second metal bumps. In such embodiment, the second conductive matrix material and the second metal bumps may support the front face of the microelectronic element above the surface of the dielectric layer.

In one embodiment, the substrate can include a dielectric layer having a first surface facing the front face of the microelectronic element and second surface opposite thereto. At least some of the conductive elements from which the metal bumps extend can be disposed at or adjacent to the first surface. At least some of the terminals can be exposed at the second surface. In such embodiment, the metal bumps can project above the first surface of the dielectric layer.

In one embodiment, the metal bumps can be formed by wire bonds. In a particular example, at least some of the wire bonds can be bonded at first and second ends to the conductive elements of the substrate and the conductive matrix material can contact at least a portion of the wire bonds between the first and second ends. In one example, the conductive matrix material can cover the at least some wire bonds from the first ends to the second ends.

In one example, the metal bumps can consist essentially of extruded copper or gold wire.

In examples, the metal bumps can have frusto-conical, cylindrical or substantially spherical shape.

In a particular example, the conductive matrix material may include a reactive polymer and a fluxing agent. The conductive matrix material may include a first metal having a first melting point, and a second metal having a second melting point at least 20 percent higher than the first melting point. The conductive matrix material may include silver.

In accordance with another aspect of the invention, a microelectronic package can include a microelectronic element having a front face having contacts thereon, the front face defining horizontal directions parallel thereto. A substrate can overlie the front face of the microelectronic element and include a plurality of terminals and leads electrically connected with the terminals, the leads extending in at least one of the horizontal directions beyond at least one edge of the substrate. A conductive matrix material can contact portions of the leads beyond the at least one edge of the substrate and join the leads with the contacts of the microelectronic element.

In one example, the substrate has first and second major surfaces and an aperture extending between the first and second major surfaces, and the at least one edge of the substrate is an edge of the aperture.

In one example, at least some of the portions of the leads beyond the at least one edge are bent towards the front face of the microelectronic element. In a further example, at least some of the portions of the leads beyond the at least one edge are not bent towards the front face of the microelectronic element.

A system according to an aspect of the invention can include a microelectronic package as described above and one or more other electronic components electrically connected with the assembly. The system may further include a housing, and the package and the other electronic components can be mounted to the housing.

A method of fabricating an interconnection element according to an aspect of the invention can include applying a conductive matrix material to respective ones of metal bumps projecting vertically above conductive elements of a substrate extending in first and second horizontal directions, the conductive elements being electrically connected to terminals. The conductive elements may be displaced from the terminals in at least one of the horizontal directions.

A method of fabricating a microelectronic assembly according to an aspect of the invention can include joining metal bumps of a substrate to contacts of a microelectronic element, in which the substrate has a conductive matrix material contacting ones of metal bumps, the metal bumps project from the conductive elements of the substrate, and the conductive elements are electrically connected to terminals of the substrate.

BRIEF DESCRIPTION OF THE DRAWINGS

Various embodiments of the present invention will be now described with reference to the appended drawings. It is appreciated that these drawings depict only some embodiments of the invention and are therefore not to be considered limiting of its scope.

FIG. 4 is a plan view of the microelectronic assembly shown in FIG. 3;

FIG. 5A is a diagrammatic sectional view of a variation of the microelectronic assembly of FIG. 1;

FIG. 5B is a diagrammatic sectional view of a variation of the microelectronic assembly of FIG. 1;

FIG. 6 is a plan view of the microelectronic assembly shown in FIG. 5A;

DETAILED DESCRIPTION

Figure 1:
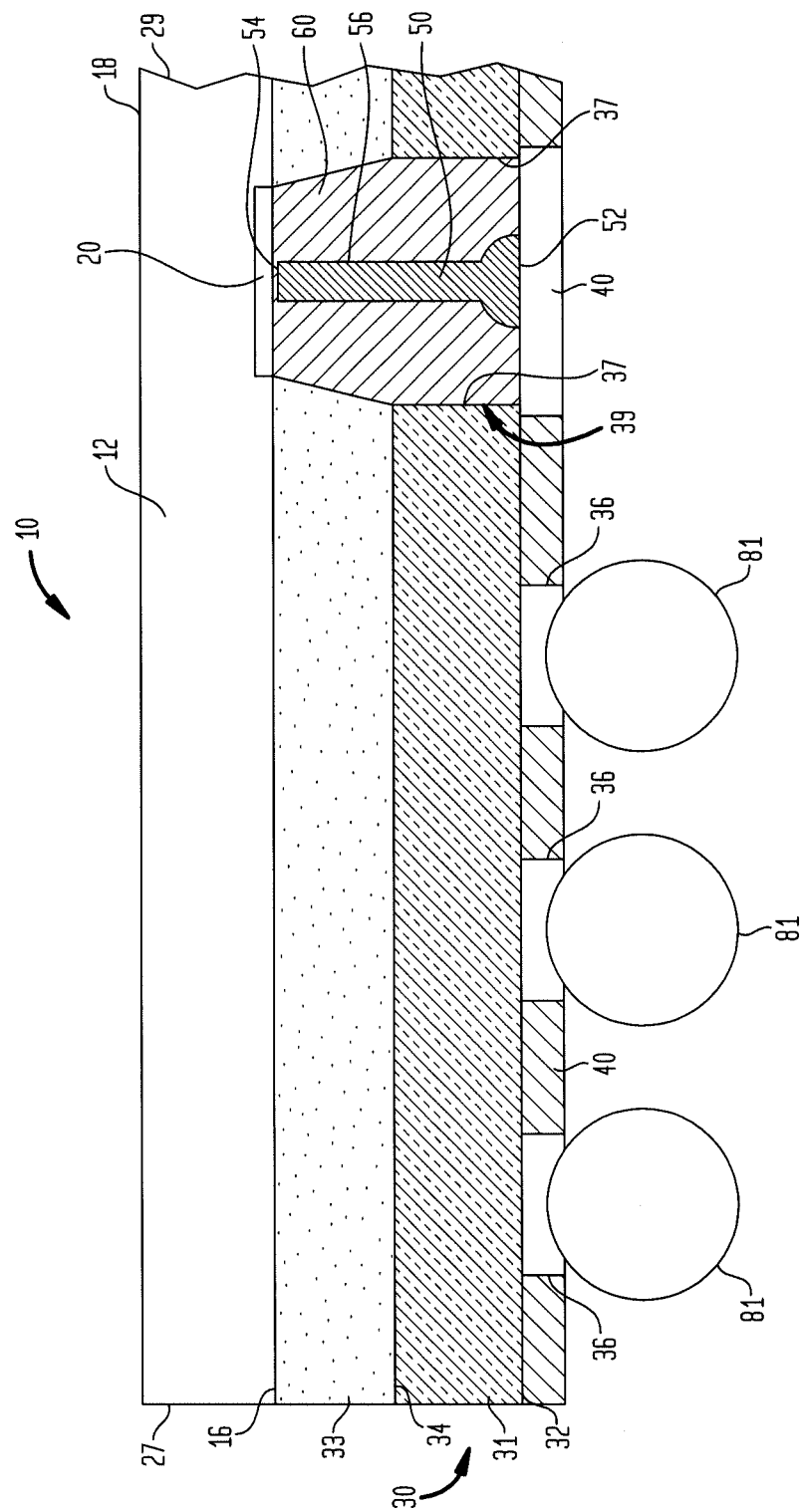
FIG. 1 is a diagrammatic sectional view of a microelectronic assembly in accordance with an embodiment of the present invention.
Figure 2:
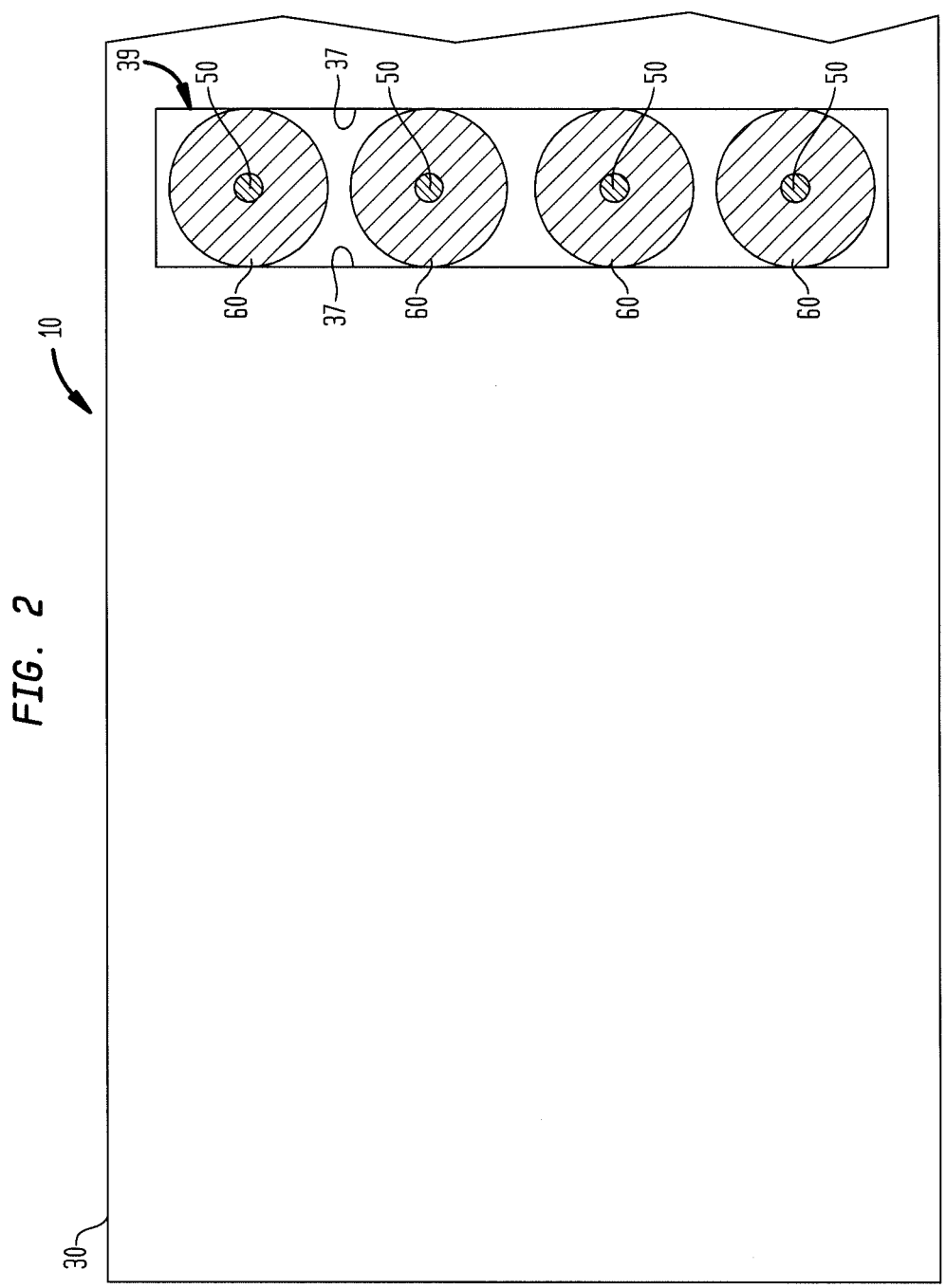
FIG. 2 is a plan view of the microelectronic assembly shown in FIG. 1.

With reference to FIGS. 1 and 2, a microelectronic assembly or package 10 according to an embodiment of the present invention includes a microelectronic element 12 in a face down or flip-chip position. In some embodiments, the microelectronic elements 12 may be a semiconductor chip or an element including a semiconductor chip, which has contacts at the front surface 16 thereof. The semiconductor chip may be a thin slab of a semiconductor material, such as silicon or gallium arsenide, and may be provided as individual, pre-packaged units. The microelectronic element 12 is electrically connected with a substrate 30 as discussed in detail below. In turn, in one embodiment, the substrate 30 can electrically connect with a circuit panel, such as a printed circuit board, through conductive masses, e.g., solder balls 81, which attach to terminals, e.g., pads or lands 36 of assembly 10.

The microelectronic element 12 may include a semiconductor chip configured predominantly to perform a logic function, such as a microprocessor, application-specific integrated circuit ("ASIC"), field programmable gate array ("FPGA") or other logic chip, among others. In other examples, the microelectronic element 12 can include or be a memory chip such as a flash (NOR or NAND) memory chip, dynamic random access memory ("DRAM") chip or static random access memory ("SRAM") chip, or be configured predominantly to perform some other function. The microelectronic element 12 has a front face 16, a rear surface 18 remote therefrom, and first and second edges 27, 29, extending between the front and rear surfaces.

Electrical contacts 20 are exposed at the front face 16 of the first microelectronic element 12. As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure may project from such surface; may be flush with such surface; or may be recessed relative to such surface and exposed through a hole or depression in the structure. Electrical contacts 20 may include bond pads or other conductive structure such as bumps, posts, etc. The bond pads may include one or more metals such as copper, nickel, gold or aluminum, and may be about 0.5 µm thick. The size of the bond pads can vary with the device type but will typically measure tens to hundreds of microns on a side. Electrical contacts 20 may be arranged in one or more parallel rows extending horizontally along the front face 16 of the microelectronic element 12. The front face 16 may therefore define horizontal directions substantially parallel to the electrical contacts 20.

In certain embodiments, the substrate 30 may have a dielectric element 31 of various types of construction, such as of polymeric material, e.g., polyimide, BT resin, or composite material such as epoxy-glass, e.g., FR-4. The substrate 30 can include electrically conductive elements 40 and has terminals at or exposed at a surface 32 for interconnection with contacts of a circuit panel, for example. The electrically conductive elements 40 may be traces, substrate contacts, or other conductive elements electrically connected with the terminals 40. In another example, the substrate 30 can consist essentially of glass, ceramic material or a semiconductor material such as silicon, or alternatively include a layer of semiconductor material and one or more dielectric layers thereon. Such glass, ceramic or semiconductor substrate may have a coefficient of thermal expansion of less than 7 parts per million/° C.

The microelectronic assembly 10 further includes one or more metal bumps 50 projecting from the substrate 30 towards the microelectronic element 12. The metal bumps 50 may extend through the aperture 39 of the substrate 30 and may be arranged in one or more rows, as seen in FIG. 2. In some embodiments, the metal bumps 50 may be wire studs, pillars, columns, cores or any other suitable configuration and may be made of any electrically conductive material, such as copper, copper alloys, gold, aluminum, nickel or combinations thereof. Each metal bump 50 has a first end 52 adjacent to the substrate 30 and a second end 54 remote from the substrate, and a lateral surface 56 extending between the first and second ends 52 and 54. The first end 52 of each metal bump 50 can be joined to an electrically conductive element 40, e.g., a pad, trace, which in turn is electrically connected with a terminal 36 of the substrate 30.

A conductive matrix material 60 contacts the second end 54 of each metal bumps 50 and at least some portion of the lateral surfaces 56 of the metal bumps. In some embodiments, the conductive matrix material may extend along the lateral surfaces 56 of the metal bump 50 within the aperture 39 of the substrate 30, as shown in FIG. 1. The conductive matrix material may even enclose all the lateral surfaces 56 of the metal bump 50. As further seen in FIGS. 1 and 2, the substrate 30 may be in direct contact with the conductive matrix material 60 at one or more edges 37 of the aperture.

The contacts of the microelectronic element 12 are electrically connected with the conductive elements 40, e.g., pads of the substrate 30 via the conductive matrix material 60 and the metal bumps 50. As further seen in FIG. 1, the microelectronic assembly can include a material 33 bonding together the confronting surfaces 16, 34 of the microelectronic element 12 and the substrate 30. In one example, the material 33 can be a substantially rigid underfill. For example, the underfill can be deposited in the interstitial volume between the microelectronic element 12 and the substrate 30 after joining the microelectronic element with the substrate. Alternatively, the underfill can be a no-flow underfill such as deposited on the substrate prior to joining with the microelectronic element 12 as further described below.

In another example, the material can be an adhesive layer which can have some compliancy, and which may be more compliant, less compliant, or have about the same compliancy as the electrical interconnections between the microelectronic element 12 and the substrate 30 through the conductive matrix material 60 and the metal bumps 50.

Figure 3:
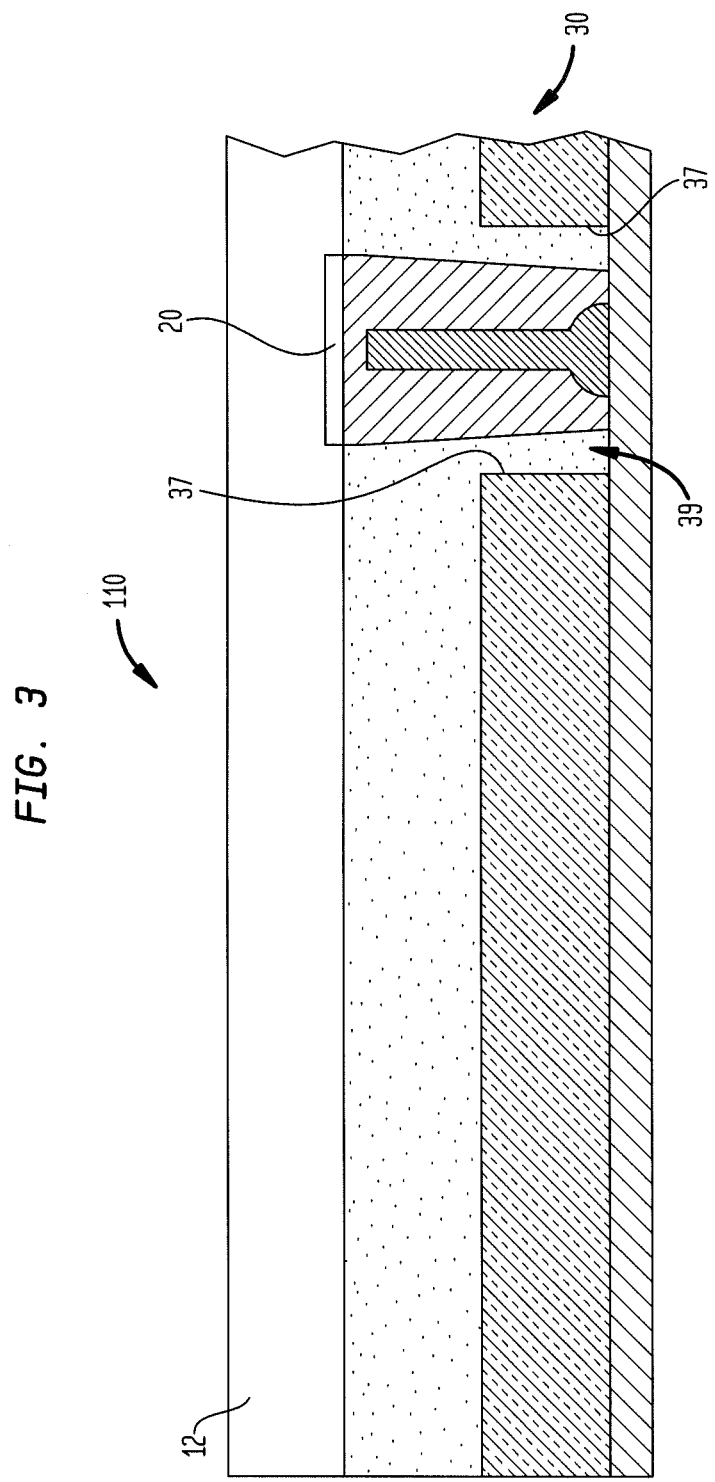
FIG. 3 is a diagrammatic sectional view of a variation of the microelectronic assembly of FIG. 1.

FIGS. 3 and 4 show a variation of the embodiment seen in FIG. 1. The microelectronic package 110 is similar to the microelectronic package 10 shown in FIG. 3, but the conductive matrix material 60 does not contact an edge 37 of aperture 39 of the substrate 30. As seen in FIG. 3, the conductive matrix material 60 can extend through the aperture 39 of the substrate and be in electrical contact with a contact 20 of the microelectronic element 12.

FIGS. 5A and 6 show a variation of the embodiment shown in FIG. 1. In this variation, the metal bumps 50' with the conductive matrix material thereon extend from conductive elements 41 at or adjacent to a first surface 34 of substrate 30. The substrate may further include electrically conductive vias 43 extending from the conductive elements 41 through the substrate 30 and to the electrically conductive elements 40 disposed at the second surface 32 of the substrate.

FIG. 5B shows a variation of the embodiment seen in FIG. 3. This microelectronic package is essentially a combination of the microelectronic assemblies shown in FIGS. 3 and 5A. In this variation, the microelectronic assembly may include one or more additional metal bumps 51 atop the first surface 34 of a dielectric layer 31 of the substrate 30. Metal bumps 51 can extend from the first surface 34 of the substrate 30 toward the microelectronic element 12, with the conductive matrix material 61 disposed thereon. In one example, the conductive matrix material 61 may contact the lateral surfaces 57 of the metal bumps 51 as well as the second end 55 of each metal bump. In addition, conductive matrix material 60 extends within an aperture 39 of the substrate 30 but does not contact an edge 37 of aperture. The conductive matrix material 60 can extend through the aperture 39 of the substrate 30 and be in electrical contact with a contact 20 of the microelectronic element 12. A metal bump 50 is disposed within the conductive matrix material 60 and extends from the conductive elements 40 toward the contact 20.

Figure 7:
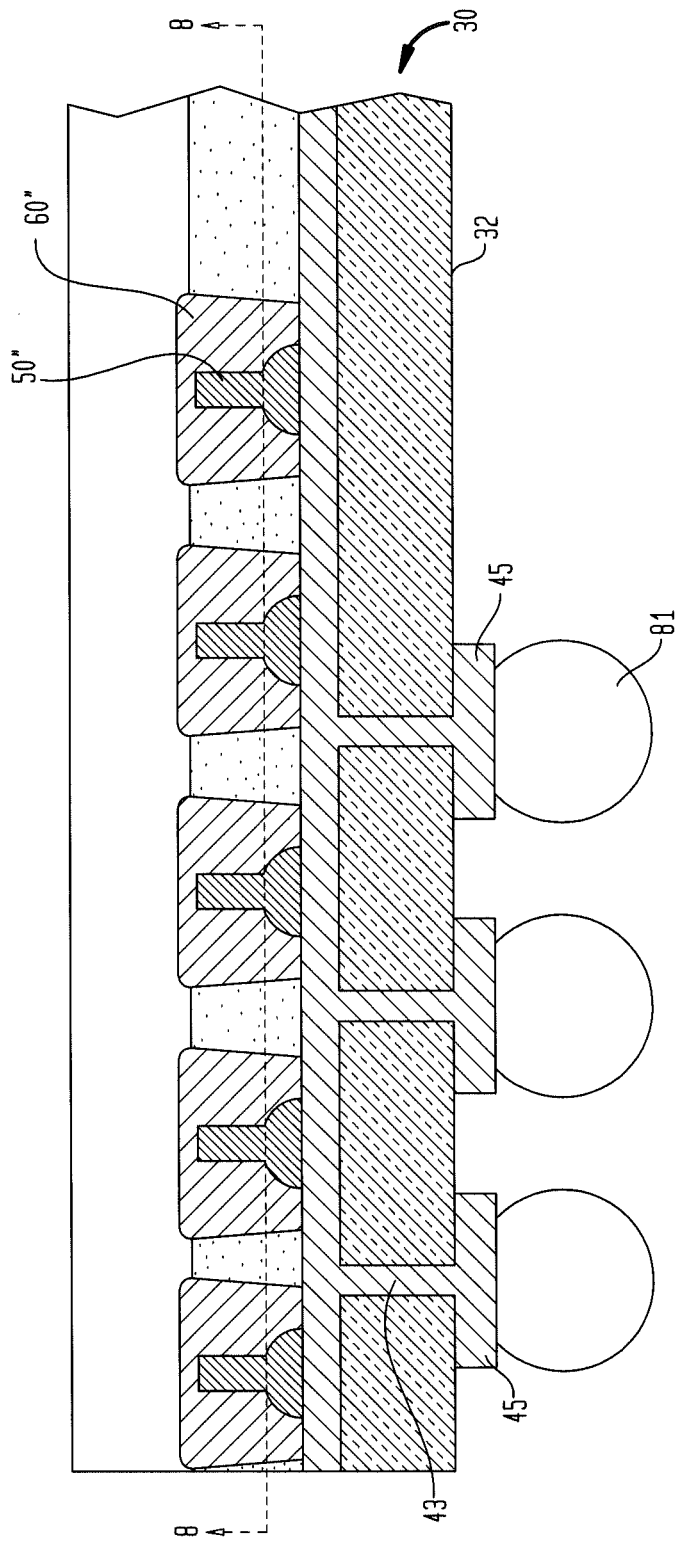
FIG. 7 is a diagrammatic sectional view of a variation of the microelectronic assembly of FIG. 1.
Figure 8:
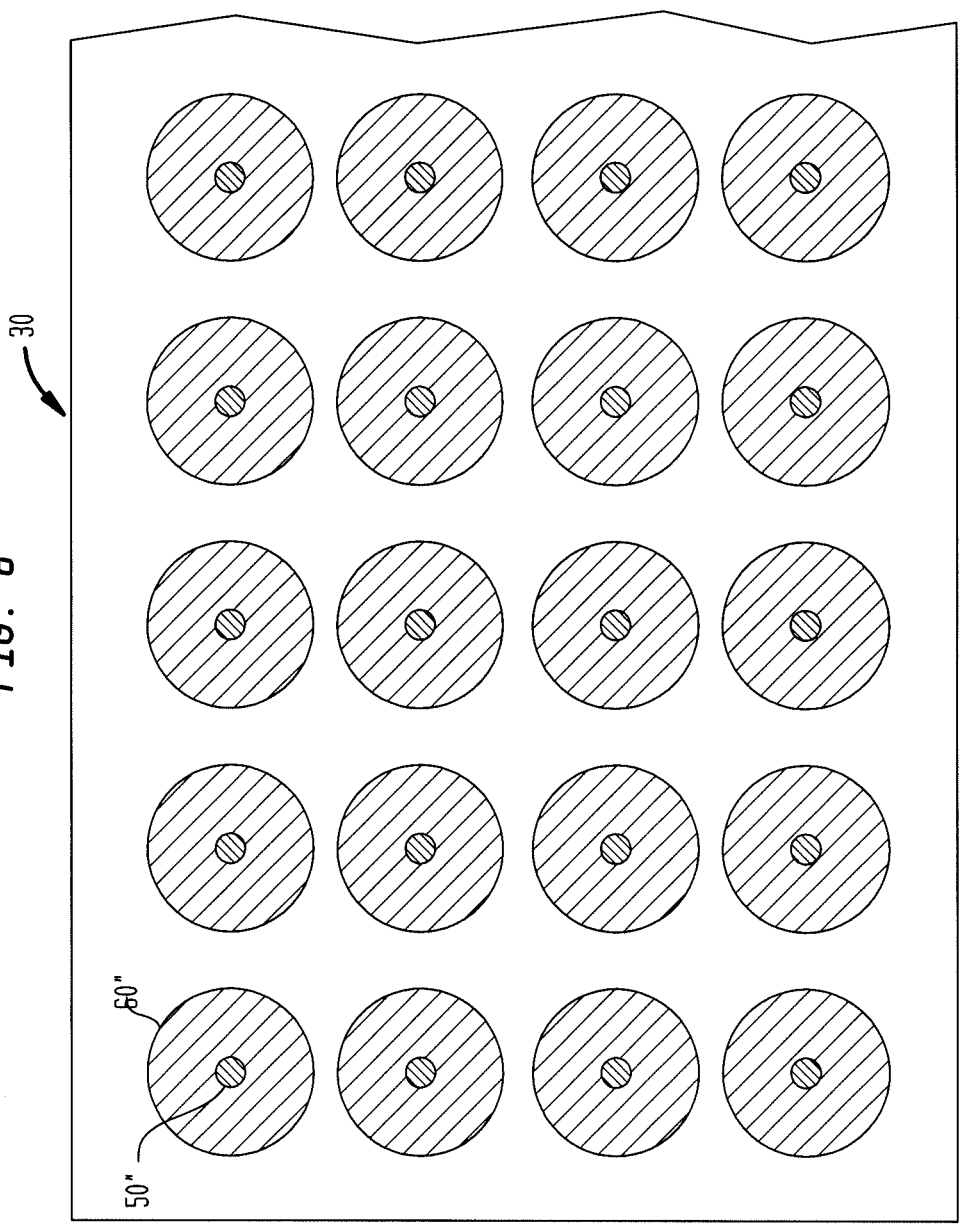
FIG. 8 is a plan view of the microelectronic assembly shown in FIG. 7.

FIGS. 7 and 8 shows a variation of the embodiment seen in FIG. 5A. In this variation, electrically conductive pads 45 are exposed on the second surface 32 of the substrate 30. The pads 45 are electrically connected with the electrically conductive vias 43 and the joining units 81. As seen in a further example in FIG. 8, the metal bumps 50" and conductive matrix material 60" can be arranged in an area array for electrical interconnection with corresponding area array contacts of a microelectronic element.

Figure 9:
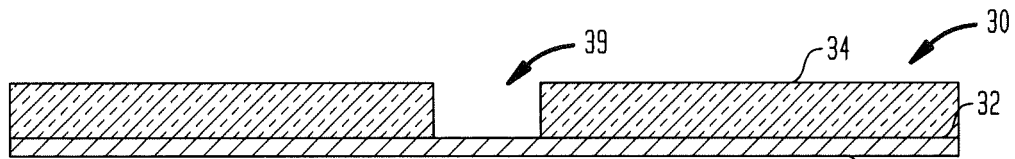
FIGS. 9, 10, 11, 12 and 13 illustrate stages in one or more methods for manufacturing a microelectronic assembly according to FIG. 1 or any variation thereof.

FIGS. 9, 10, 11, 12 and 13 illustrate an exemplary process usable for manufacturing any of the variations of the microelectronic package described above. As seen in FIG. 9, a second surface 32 of a substrate has electrically conductive elements 40 thereon. The substrate 30 may have an aperture 39 extending between its first and second surfaces 34, 32.

Figure 10:
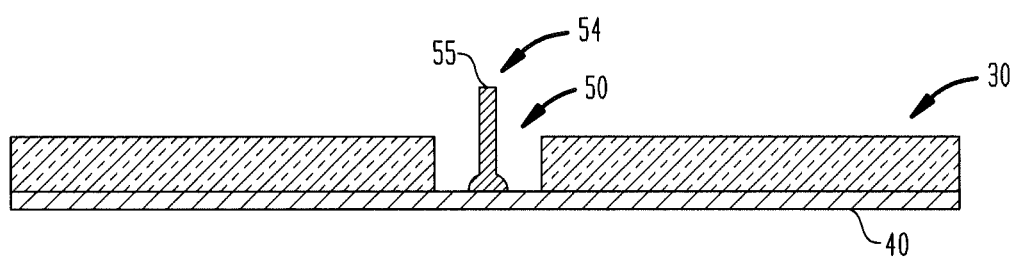

As shown in FIG. 10, one or more metal bumps 50 are formed on a portion of the electrically conductive elements 40 at least partially aligned with the aperture 39 of the substrate 30. In one example, the metal bumps 50 can be made from a conductive material such as copper, gold, nickel, solder, aluminum or the like. Additionally, metal bumps 50 can be made from combinations of materials, such as from a core of a conductive material, such as copper or aluminum, for example, with a coating of another material applied over the core. The coating can be of a second conductive material, such as aluminum, nickel or the like. The metal bumps can be formed additively such as by plating, joining or bonding, or subtractively, such as by etching or otherwise patterning a pre-existing metal layer.

In one example, the bumps 50 can be formed by bonding a metal wire to the conductive element, e.g., as a ball bond thereon, and then retracting the tool from the conductive element and then clipping the wire at a height from the conductive element. In such example, the wire used to form metal bumps 50 can have a thickness, i.e., in a dimension transverse to the wire's length, of between about 15 μm and 150 μm. In a particular embodiment, the wire used to form a metal bump can be cylindrical in cross section. Otherwise, the wire fed from the tool may have a polygonal cross section such as rectangular or trapezoidal, for example.

The free end 54 of the metal bump 50 has an end surface 55. In a particular example, the end surface 55 can form at least a part of a contact in an array formed by respective end surfaces 55 of a plurality of metal bumps 50.

Figure 11:
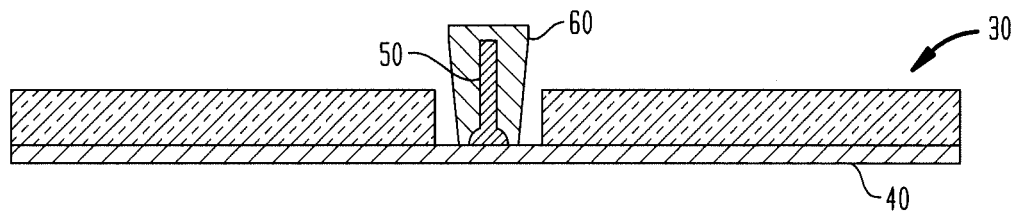

The conductive matrix material 60 may then be deposited on the metal bumps 50, as shown in FIG. 11. Conductive matrix material 60 can be applied to the metal bumps in many different ways. A transfer printing process involves providing a mandrel having grooves that correspond to the positions of the metal bumps. The grooves can be filled with material and a transfer tool, such as compliant pad, is applied to the mandrel such that material shifts onto the surface of the transfer tool. The transfer tool is then applied to the substrate such that the material is deposited at the appropriate locations to form masses of the conductive matrix material 60 on the metal bumps 50. An inkjet process of spraying atomized material, including silver or copper nanoparticles, can be used to form the masses of conductive matrix material 60. Other methods of forming the masses of the conductive matrix material 60 can include dispensing, stenciling, screen printing, or laser printing, among others.

Figure 12:
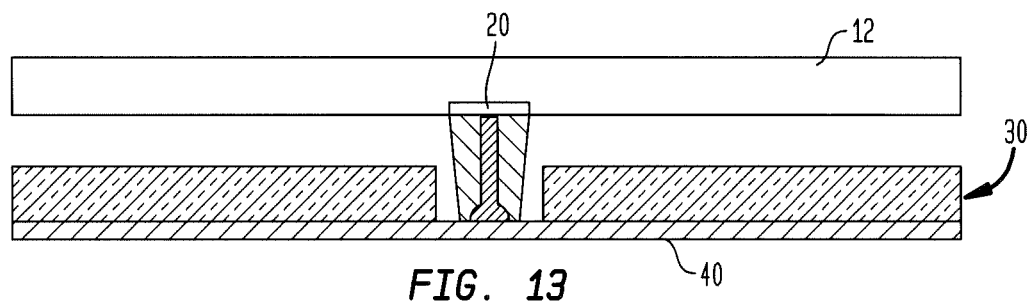
Figure 13:
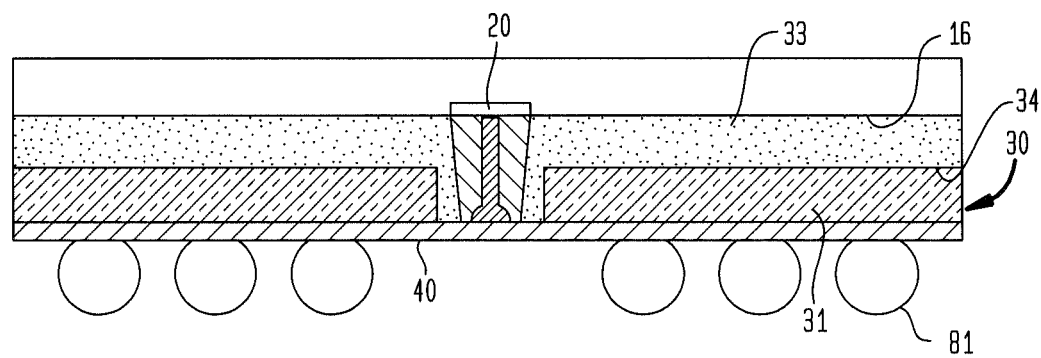

After the above-described structure is formed, the microelectronic element 12 can be mated with the substrate 30 such that the masses of the conductive matrix material 60 are aligned with respective contacts 20 of the microelectronic element 12, as seen in FIG. 12. An adhesive or underfill may be provided between the microelectronic element 12 and the substrate 30, as seen in FIG. 13. In one example, an underfill 33 can be deposited between the confronting surfaces 16, 34 of the microelectronic element 12 and the substrate 30, respectively, after assembling the microelectronic element with the substrate. In another example, an adhesive or underfill layer 33 can be provided, e.g., as a "no-flow underfill" on one or both of the confronting surfaces 16, 34, and then the microelectronic element 12 can be assembled with the substrate 30 to form the structure as seen in FIG. 13. When an adhesive is used, the adhesive can be more compliant, less compliant, or have about the same compliancy as the electrical interconnections between the microelectronic element 12 and the substrate 30 provided by the metal bumps 50 and conductive matrix material. In yet another example, a dielectric element 31 of the substrate 30 may include a B-staged material of not fully cured polymer which may directly bond the substrate 30 to the face 16 of the microelectronic element 12.

Subsequently, the microelectronic element 12 with the substrate 30 attached thereto can be heated to a sintering temperature which then sinters the conductive matrix material 60 and forms a permanent electrical and mechanical connection between the contacts 20 of the microelectronic element 12 and the corresponding metal bumps 50 of the substrate. As deposited, i.e., before sintering, the conductive matrix material can include particles or flakes of a high melting-point material such as copper or silver, and particles or flakes a low melting-point material, such as tin, bismuth, or a combination of tin and bismuth. Some particles may have a structure which includes metal or non-metal cores, for example, polymer, silica or graphite cores, and a different metal such as a low melting-point metal thereon.

During the sintering process, the high and low melting point metals fuse together, typically forming intermetallics therebetween, and forming a solid matrix of metal which can have an open cell foam-like appearance. The deposited conductive matrix material may include a medium which escapes from the metallic component thereof during the sintering process, such as by evaporation, such that the conductive matrix material may have voids therein. Alternatively, the conductive matrix material may include a reactive polymer component. Typically, the polymer component cross-links and cures as a result of the sintering process. The polymer component can become interspersed throughout the metal matrix as a result of the sintering process, the polymer material typically being connected together in open cells of the metal matrix. The metal matrix and polymer interspersed throughout may then form a solid conductive structure.

Under certain conditions, after sintering, the conductive matrix material forms a solid structure which subsequently cannot be reflowed except at a temperature substantially higher than the temperature at which the sintering process is performed. Such result may be obtained by sintering particularly when a low melting-point metal, e.g., tin or bismuth, is substantially consumed in the formation of intermetallics with at least one other metal component, of the conductive material, e.g., copper.

Depending upon the application, the temperature at which the conductive matrix material is sintered can be substantially lower than a reflow temperature at which alternative connections made of solder would need to be formed. Metals, e.g., copper, silver added to solder to improve mechanical resilience can increase the melting-temperature of the solder. Thus, the structure herein of metal bumps 50 and conductive matrix material 60 thereon may provide a more mechanically robust system with a lower joining temperature than corresponding solder connections.

In such case, use of such conductive matrix material can help avoid problems associated with higher temperature joining processes. For example, lower temperature joining processes achieved using a conductive matrix material can help avoid undesirable changes in substrates which include organic materials whose glass transition temperatures are relatively low. Also, lower temperature joining processes may help to address concerns during such joining processes relating to differential thermal expansion of the substrate relative to the microelectronic element. In this case, a lower temperature joining process can lead to improved package reliability since reduced thermal excursion during the joining process can lead to less stresses being locked into the assembled microelectronic package. Thus, the microelectronic package has less built-in stresses. In other words, the process described above may decrease internal stress during reflow because the substrate expands less.

In a particular example, the conductive matrix material may include a fluxing component as deposited. The fluxing component can assist in removing oxidation byproducts during the sintering process.

In one embodiment, the joining process can be conducted using a conductive matrix material that does not have a fluxing component. In such case, the joining process may be performed in a low pressure, e.g., partial vacuum, environment, or one in which oxygen has been evacuated or replaced with another gas.

Use of a conductive matrix material 60 to electrically connect the substrate 30 with the microelectronic element 12 may help achieve particular results. The conductive matrix material can be applied without applying high forces to the contacts and conductive elements which are common in wirebonding and lead-bonding operations.

The deposition of the conductive matrix material in viscous phase and the subsequent fusing of the material to the contacts and conductive elements during fabrication can result in the conductive interconnects having greater surface area in contact with the contacts and conductive elements than is common with wire bonds and lead bonds. As a result of the sintering process, the conductive matrix material can wet the contacts 20, and surface tension between the conductive matrix material 60 and the contacts 20 can cause the material to spread over a greater surface area of the contacts, or to spread over entire surface areas of the contacts. This contrasts with direct wire-bonding and lead-bonding operations wherein the bonded wires or leads typically do not contact entire surface areas of contacts, e.g., bond pads. These characteristics of the conductive matrix material may help to reduce the incidence of defects in the conductive connections within assemblies or packages.

In another example, the process of sintering the conductive matrix material can be performed prior to depositing an underfill 33 between confronting surfaces 16, 34 of the microelectronic element 12 and the substrate 30.

As further shown in FIG. 13, joining units 81, such as solder balls, may be attached to the electrically conductive elements 40, e.g., to terminals such as pads of the substrate. Joining units such as solder balls may be attached before the sintering process, during the sintering process, or after the conductive matrix material has been sintered.

Figure 14:
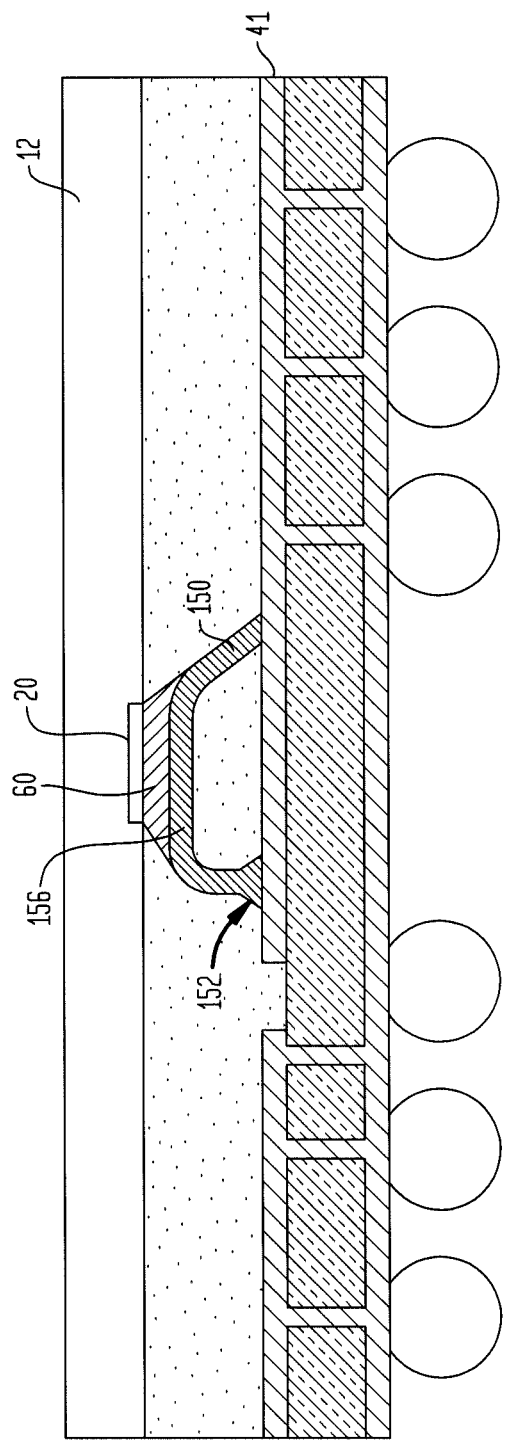
FIG. 14 is a diagrammatic sectional view of a microelectronic assembly in accordance with another embodiment of the present invention.

FIG. 14 shows a variation of the embodiment shown in FIG. 5A. In this variation, the microelectronic package includes wire bond loops 150 electrically connected with pads or electrically conductive elements 41 disposed on the first surface 34 of the substrate 30. Each wire bond 150 includes a first end 152 electrically connected to an electrically conductive element 41, a second end 154 electrically connected to the same or another electrically conductive element 41, and an intermediate segment 156 between the first and second ends. A conductive matrix material 60 is attached at least to the intermediate segment 156 of the wire bond 150 and electrically connects the wire bond 150 with the microelectronic element 12. The conductive matrix material 50 is electrically connected to contacts 20 of the microelectronic element 12. The process of manufacturing the microelectronic package of FIG. 14 may help control the height of the package.

Figure 15:
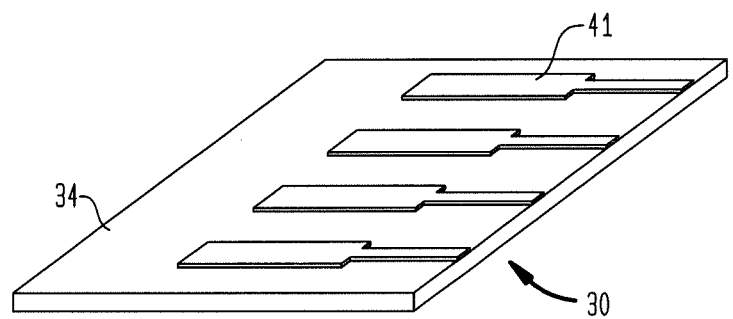
FIGS. 15, 16, 17, 18, 19 and 20 illustrate stages in one or more methods for manufacturing a microelectronic assembly according to FIG. 14 or any variation thereof.
Figure 16:
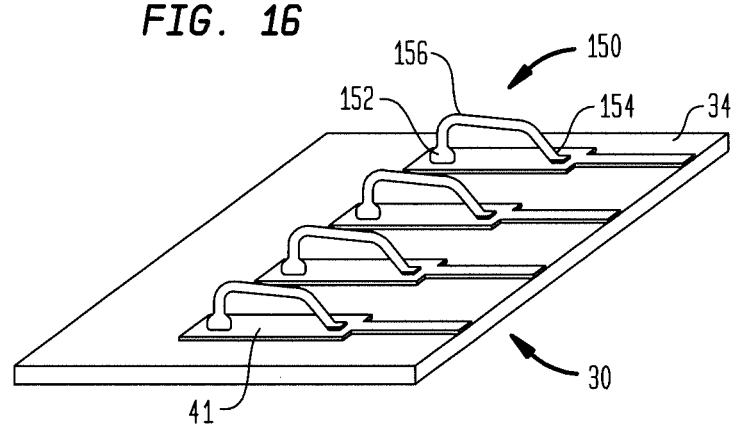
Figure 17:
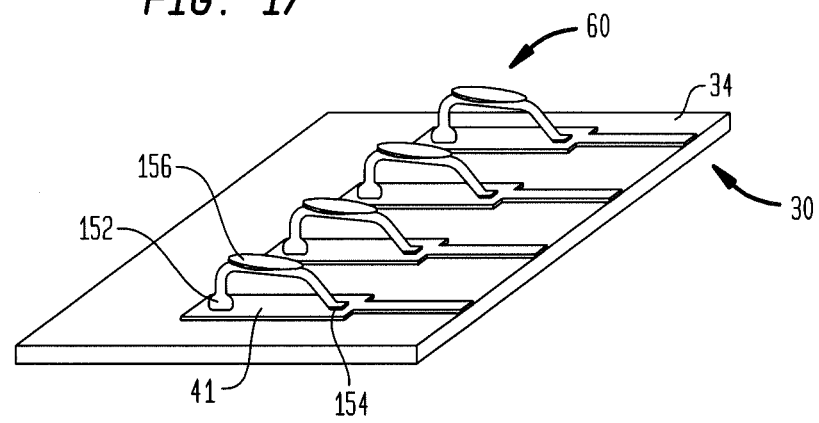
Figure 18:
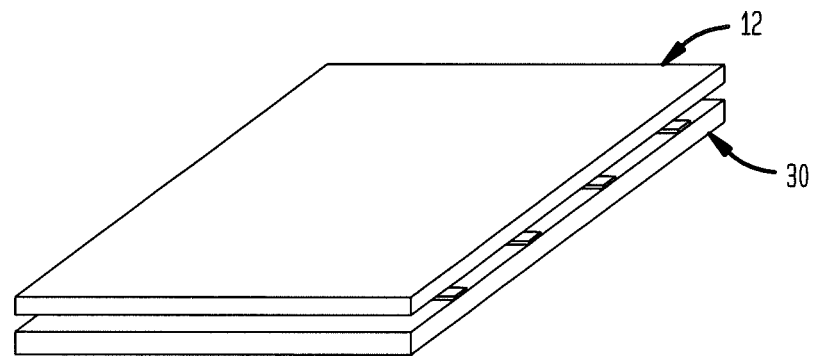
Figure 19:
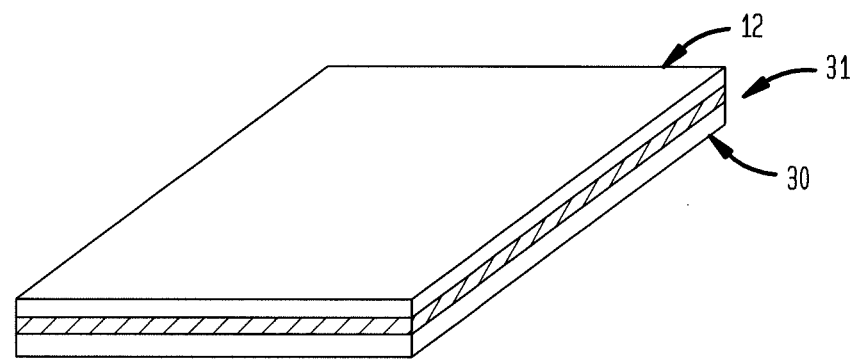

FIGS. 15, 16, 17, 18 and 19 illustrate an exemplary process for manufacturing a microelectronic package as shown in FIG. 14. As seen in FIG. 15, electrically conductive elements 41, such as pads, are exposed at a first surface 34 of the substrate 30. Wire bonds 150 (FIG. 16) can then be formed using, for example, the wirebonding process described above. Regardless of the process employed, the wire bonds 150 are electrically connected to the electrically conductive elements 41. For example, the first and second ends 152 and 154 of a wire bond 150 may be attached to the same electrically conductive element 41 as seen in FIG. 16. Then, as seen in FIG. 17, the conductive matrix material 60 can be deposited at least on the intermediate segment 156 as described above. Then, as seen in FIGS. 18 and 19, the microelectronic element 12 can be assembled with the substrate and joined to the conductive elements through the conductive matrix material 60 similar to the process described above. FIG. 19 illustrates an assembly in which an underfill or adhesive 33 is disposed between confronting faces of the microelectronic element and the substrate, similar to that described above relative to FIG. 13.

Figure 20:
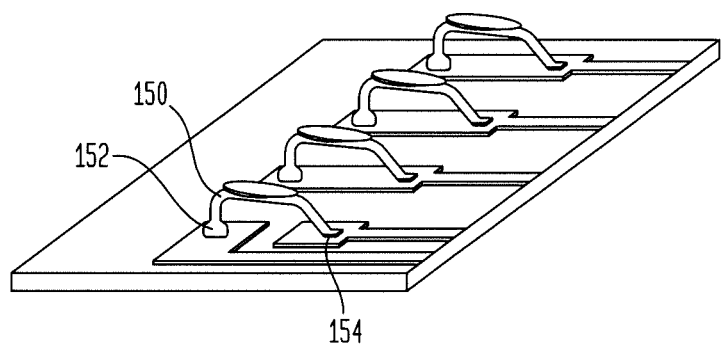

As seen in FIG. 20, in a variation of the above-described embodiment, a first end 152 of wire bond 150 can be electrically connected to one electrically conductive element 41, while the second end 154 of the same wire bond 150 is connected to another electrically conductive element 41. The conductive elements may be electrically connected together at another location, for example, at another location of substrate or at another location on a circuit panel which can be connected with the microelectronic package.

Figure 21:
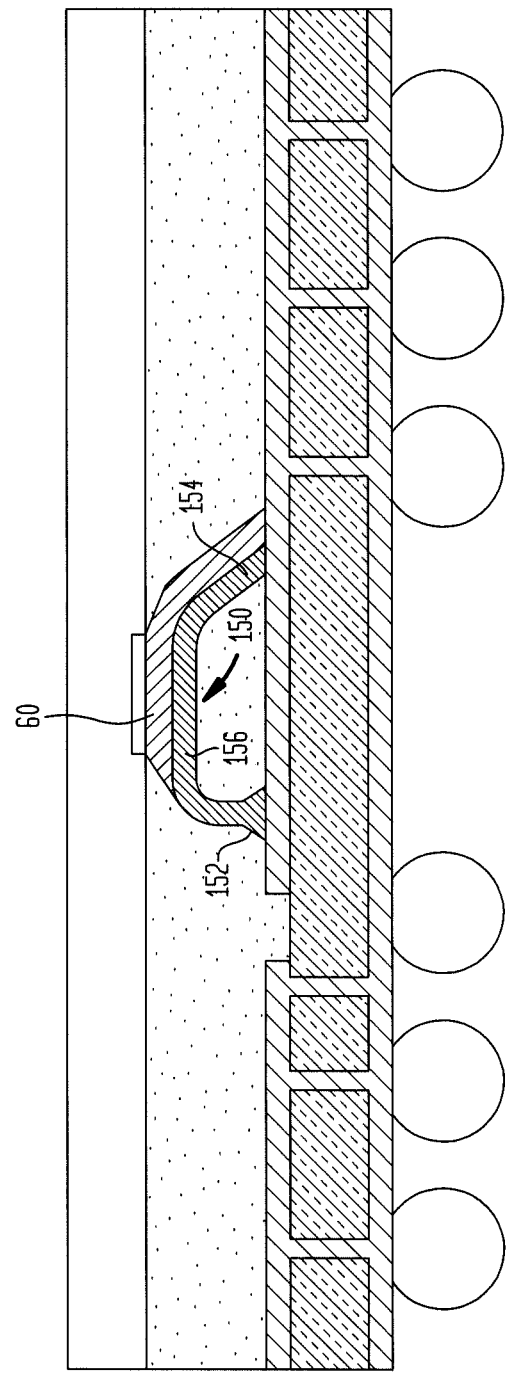
FIG. 21 is diagrammatic sectional view of a variation of the microelectronic assembly of FIG. 14.

FIG. 21 shows a variation of the microelectronic package shown in FIG. 14. In this variation, the conductive matrix material 60 extends along the intermediate segment and at least one end 152 or 154 of the wire bond 150.

Figure 22:
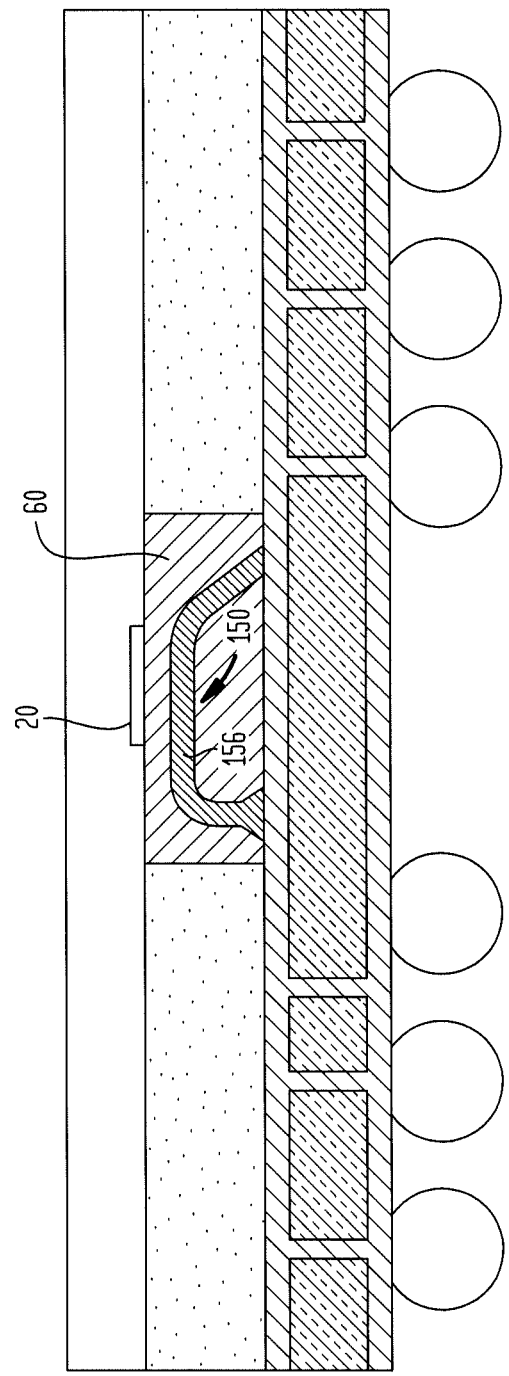
FIG. 22 is a diagrammatic sectional view of a variation of the microelectronic assembly of FIG. 14.

FIG. 22 shows a variation of the microelectronic package shown in FIG. 14. In this variation, the conductive matrix material may completely surround the wire bond 150 including its intermediate segment 156.

Figure 23:
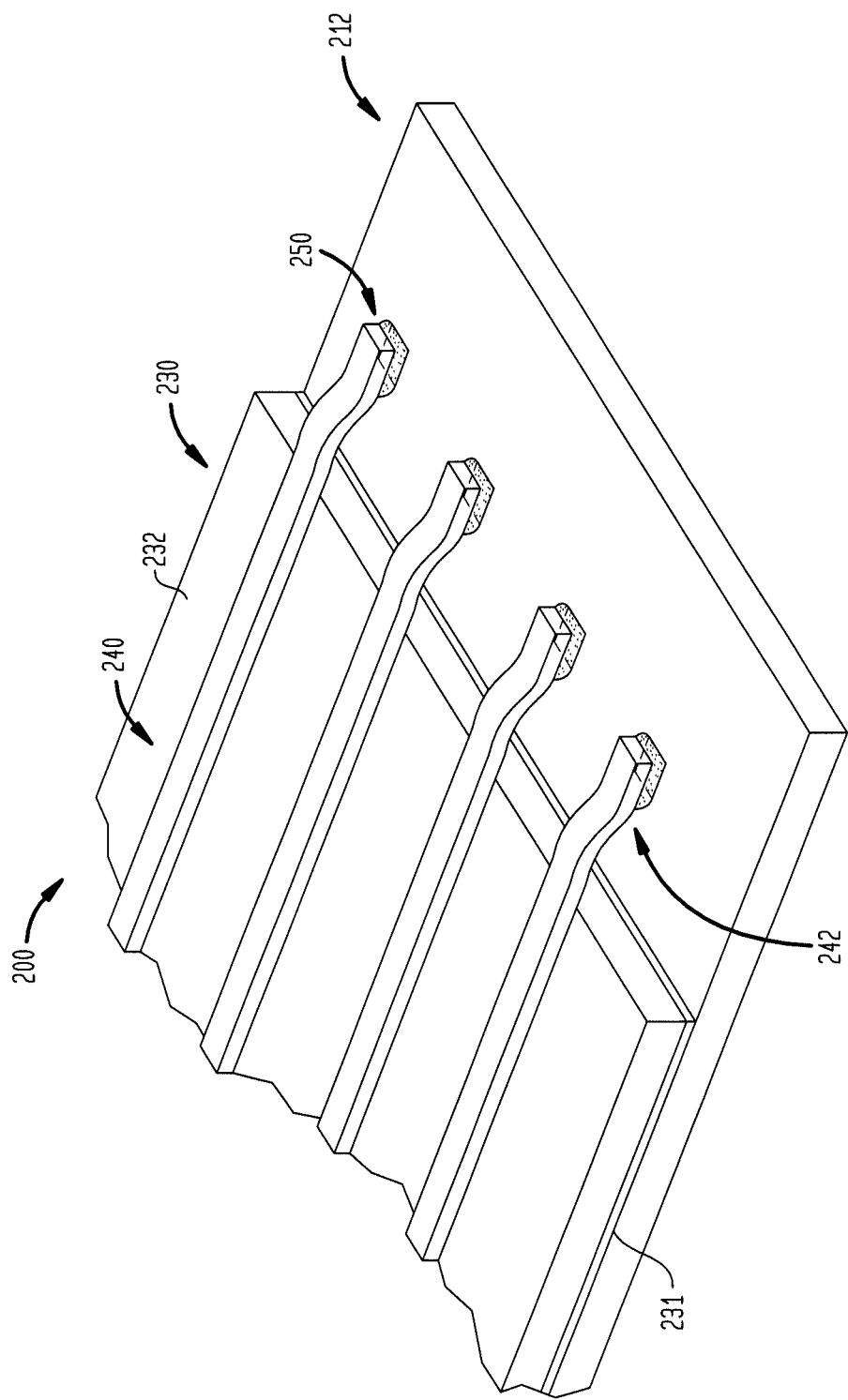
FIG. 23 is a perspective view of an electrical interconnection in accordance with an embodiment of the present invention.

FIG. 23 shows an alternative embodiment of a microelectronic package. In this embodiment, the microelectronic package 200 includes a substrate 30 and electrically conductive elements 240, such as traces or beam leads, extending along a first surface 232 of the substrate. The electrically conductive elements 240 have a free end 242 that may be bent toward a microelectronic element 212. As discussed below, the free end 242 of the electrically conductive element 240 does not necessarily have to be bent. An adhesive layer 231 may bond the substrate 230 to the microelectronic element 12. A metal bump 250, which may be made of conductive matrix material, is disposed at the free end 242 of each electrically conductive element 240. The metal bumps 250 are electrically connected to the microelectronic element 212 and may be aligned with an aperture of the substrate.

Figure 24A:
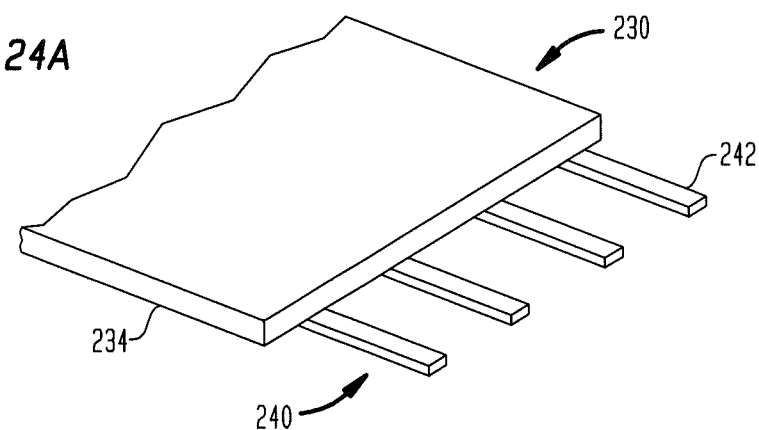
FIGS. 24A, 24B, 25A, 25B, 26A, 26B, 27A, 27B, 28A and 28B are views illustrating stages in one or more methods for forming the electrical interconnection according to FIG. 23 or any variation thereof.
Figure 24B:
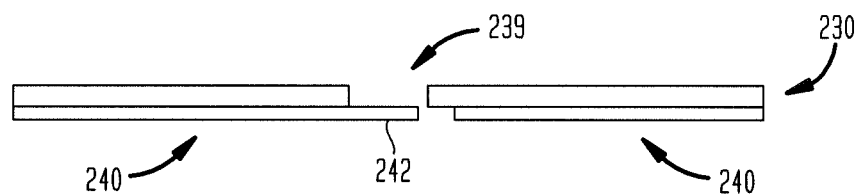
Figure 25A:
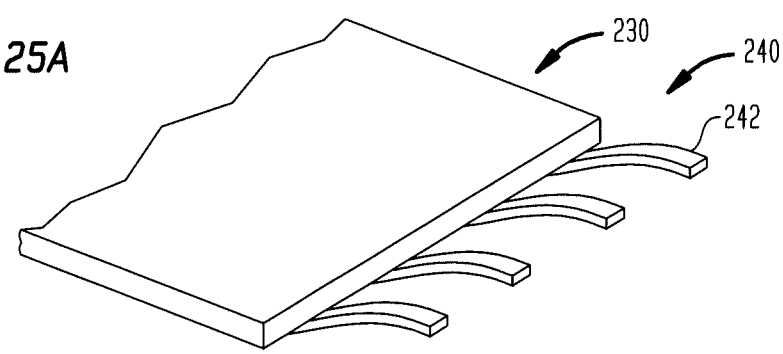
Figure 25B:
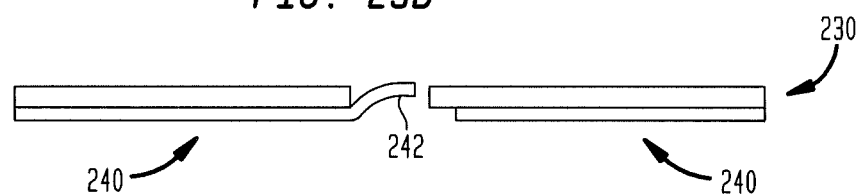
Figure 26A:
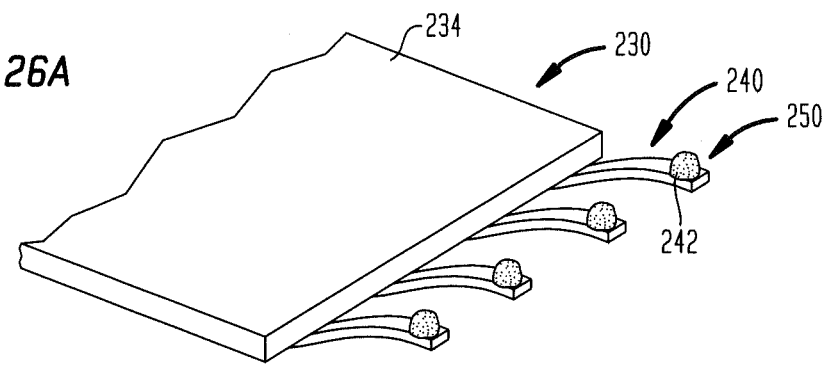
Figure 26B:
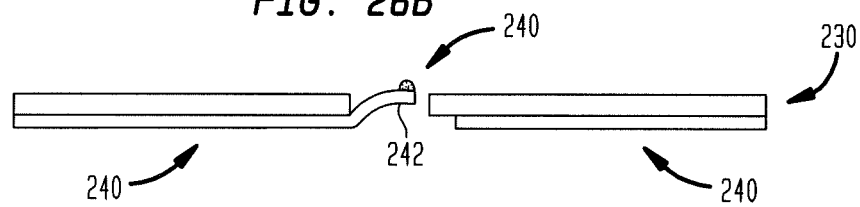
Figure 27A:
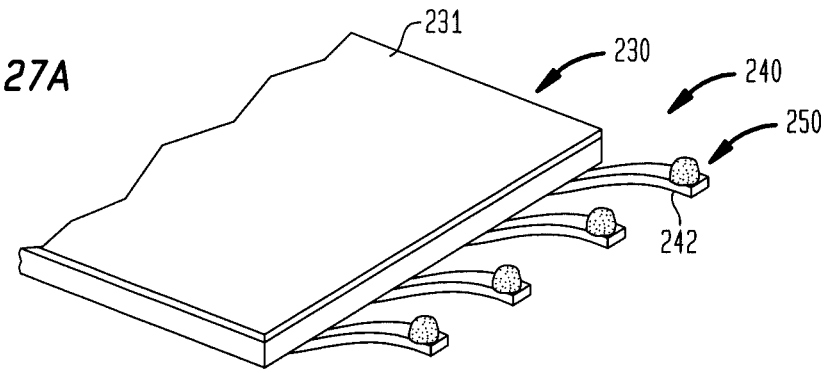
Figure 27B:
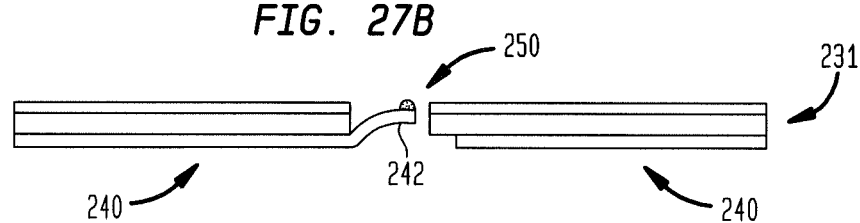
Figure 28A:
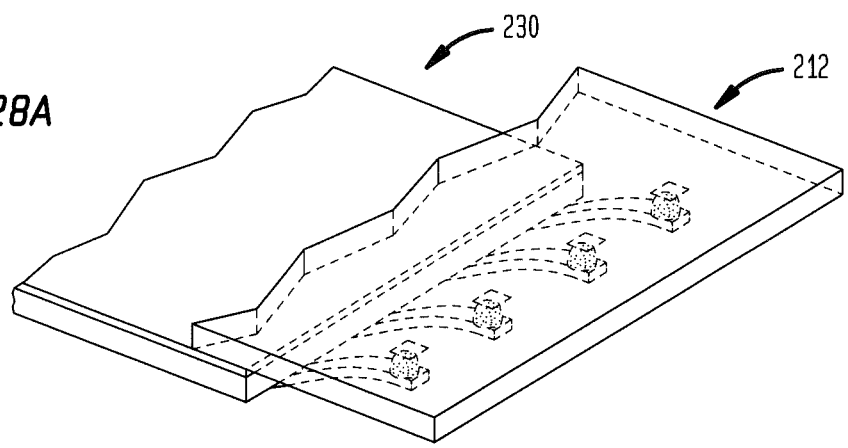
Figure 28B:
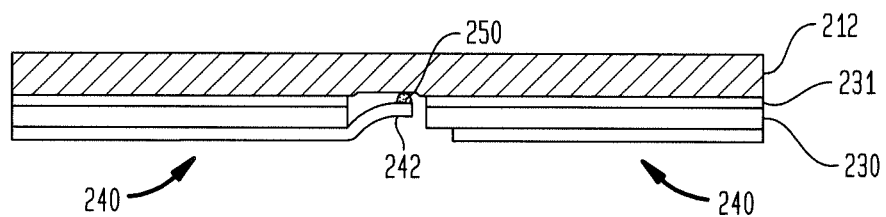

FIGS. 24A-28B illustrate a process of manufacturing the microelectronic package 200 depicted in FIGS. 24A and 24B. This process may also be used to make any of the other microelectronic packages described in the present application. As seen FIGS. 24A and 24B, electrically conductive elements 240 such as ben leads extend along a first surface 232 of a substrate 230. The free ends 242 of the electrically conductive elements 240 should be at least partially aligned with an aperture 239 of the substrate 230. As seen in FIGS. 25A and 25B, the free ends 242 of the electrically conductive elements 240 are bent upward into the aperture 239 of the substrate 230. Masses 250 of conductive matrix material are deposited on the free ends 242 of the electrically conductive elements 240, as seen in FIGS. 26A-26B. The masses 250 may be deposited after the conductive elements have been bent, or alternatively before the conductive elements are bent. Referring to FIGS. 27A-27B, an adhesive layer 231 may applied to the second surface 234 of the substrate 230 for assembling the microelectronic element 12 therewith, as further shown in FIGS. 28A-28B. The adhesive layer may be applied to the substrate either before or after the conductive matrix material is deposited thereon. FIGS. 28A-28B also shows the masses 250 of conductive matrix material joined with contacts of the microelectronic element 212.

Figure 28C:
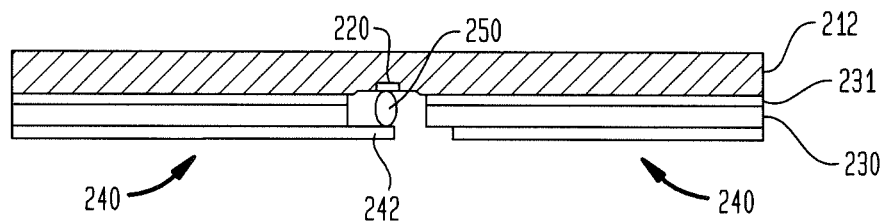
FIG. 28C is a diagrammatic sectional view of a variation of the microelectronic assembly of FIG. 14.

FIG. 28C shows a variation of the microelectronic package depicted in FIG. 23. In this variation, the free ends 242 of the electrically conductive elements 240 are not bent. Rather, the electrically conductive elements 240 are straight and conductive matrix material 250 joins the straight electrically conductive element to the corresponding contact 220 of the microelectronic element 12.

Figure 29:
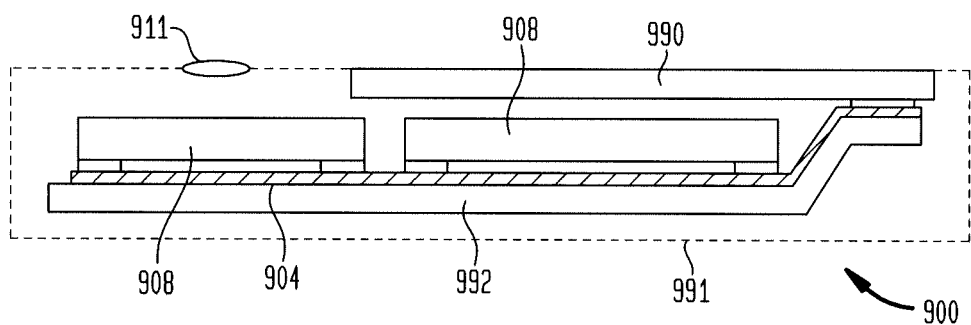
FIG. 29 is a diagrammatic sectional view of a system including any of the microelectronic assemblies described herein connected to electronic components.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory. The structures discussed above can be utilized in construction of diverse electronic systems. For example, a system 900 in accordance with a further embodiment of the invention includes a structure 906 as described above in conjunction with other electronic components 908 and 990. In the example depicted, component 908 is a semiconductor chip whereas component 990 is a display screen, but any other components can be used. Of course, although only two additional components are depicted in FIG. 29 for clarity of illustration, the system may include any number of such components. The structure 906 as described above may be, for example, a composite chip, or a structure incorporating plural chips. In a further variant, both may be provided, and any number of such structures may be used. Structure 906 and components 908 and 990 are mounted in a common housing 991, schematically depicted in broken lines, and are electrically interconnected with one another as necessary to form the desired circuit. In the exemplary system shown, the system includes a circuit panel 992 such as a flexible printed circuit board, and the circuit panel includes numerous conductors 904, of which only one is depicted in FIG. 29, interconnecting the components with one another. However, this is merely exemplary; any suitable structure for making electrical connections can be used. The housing 991 is depicted as a portable housing of the type usable, for example, in a cellular telephone or personal digital assistant, and screen 990 is exposed at the surface of the housing. Where structure 908 includes a light-sensitive element such as an imaging chip, a lens 911 or other optical device also may be provided for routing light to the structure. Again, the simplified system shown in FIG. 29 is merely exemplary; other systems, including systems commonly regarded as fixed structures, such as desktop computers, routers and the like can be made using the structures discussed above As these and other variations and combinations of the features discussed above can be utilized without departing from the present invention, the foregoing description of the preferred embodiments should be taken by way of illustration rather than by way of limitation of the invention as defined by the claims.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic package, comprising:
   a microelectronic element having a front face having contacts thereon;
   a substrate overlying the front face of the microelectronic element, the substrate including a plurality of terminals and a plurality of conductive pads electrically connected with the terminals;
   a plurality of wire bonds projecting from the conductive pads towards the microelectronic element, each wire bond having a first end and a second end opposite thereto, each of the first and second ends attached directly to a conductive pad of the plurality of conductive pads at attachment locations spaced apart from one another, wherein the wire bonds have lateral surfaces extending between the first and second ends; and
   a solid metal matrix having an open cell foam-like structure interspersed with at least one of a polymer or voids, the metal matrix formed from a conductive matrix material comprising a mixture of metals having substantially different melting-points and a non-metallic material, the conductive matrix material having been sintered in place with the second ends and at least portions of the lateral surfaces of respective ones of the wire bonds and with the contacts of the microelectronic element so as to fuse with the wire bonds and the contacts.

2. The microelectronic package of claim 1, wherein the metal matrix is fused with the lateral surfaces of the wire bonds within at least one opening of the substrate.

3. The microelectronic package of claim 1, wherein the metal matrix is fused with the entire lateral surfaces of the wire bonds.

4. The microelectronic package of claim 1, wherein the substrate includes a dielectric element having an aperture, wherein the metal matrix contacts an edge of the aperture.

5. The microelectronic package of claim 1, wherein the substrate includes a dielectric element having an aperture, the metal matrix does not contact an edge of the aperture.

6. The microelectronic package of claim 1, wherein the substrate has a surface confronting the front face of the microelectronic element, further comprising metal bumps extending in a direction between the surface of the substrate to remote ends thereof adjacent the microelectronic element and a second metal matrix contacting respective ones of the metal bumps and overlying the remote ends of the metal bumps.

7. The microelectronic element of claim 6, wherein the second metal matrix and the metal bumps support the front face of the microelectronic element above the surface of the dielectric layer.

8. The microelectronic package of claim 1, wherein the substrate includes a dielectric layer having a first surface facing the front face of the microelectronic element and second surface opposite thereto, at least some of the conductive pads from which the wire bonds extend are disposed at or adjacent to the first surface, and at least some of the terminals being exposed at the second surface.

9. The microelectronic package of claim 8, wherein the wire bonds project above the first surface of the dielectric layer.

10. The microelectronic package of claim 1, wherein at least some of the conductive pads are displaced from the wire bonds to which they are connected in at least one horizontal direction parallel to the front face of the microelectronic element.

11. The microelectronic package of claim 1, wherein each of at least some of the wire bonds have first and second ends thereof bonded to a same conductive pad of the substrate and the metal matrix contacts at least a portion of the wire bonds between the first and second ends.

12. The microelectronic package of claim 11, wherein the metal matrix covers the at least some wire bonds from the first ends to the second ends.

13. The microelectronic package of claim 1, wherein the wire bonds consist essentially of extruded copper wire.

14. The microelectronic package of claim 1, wherein the wire bonds consist essentially of extruded gold wire.

15. The microelectronic package of claim 1, wherein the conductive matrix material further includes a reactive polymer and a fluxing agent.

16. The microelectronic package of claim 1, wherein the conductive matrix material includes a first metal having a first melting point, and a second metal having a second melting point at least 20 percent higher than the first melting point.

17. The microelectronic package of claim 14, wherein the conductive matrix material includes silver.

18. The microelectronic package as claimed in claim 1, wherein the solid metal matrix has an open cell foam-like appearance with one or more of: voids or a polymer interspersed with the matrix.

19. The microelectronic package as claimed in claim 18, wherein the solid metal matrix includes intermetallics between portions of a first metal therein and a second metal therein, the first and second metals having the substantially different melting-points.

20. The microelectronic package as claimed in claim 1, wherein portions of the wire bonds between the first and second ends extend in a direction substantially parallel to a surface of the substrate at which the conductive pads are provided.

* * * * *